US008320132B2

(12) United States Patent
Lu et al.

(10) Patent No.: US 8,320,132 B2
(45) Date of Patent: Nov. 27, 2012

(54) COMPUTER MOTHERBOARD

(75) Inventors: Xiu-Dong Lu, Shenzhen (CN); Yi Rui, Shenzhen (CN); Jing-Li Xia, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 324 days.

(21) Appl. No.: 12/796,784

(22) Filed: Jun. 9, 2010

(65) Prior Publication Data

US 2011/0249409 A1 Oct. 13, 2011

(30) Foreign Application Priority Data

Apr. 12, 2010 (CN) .......................... 2010 1 0144354

(51) Int. Cl.
*H05K 1/00* (2006.01)

(52) U.S. Cl. ......... 361/748; 345/3.1; 345/204; 345/520; 348/100; 348/476; 348/558; 370/395.64; 710/2; 710/301; 710/313; 715/700

(58) Field of Classification Search .................. 361/748; 345/3.1, 204, 520; 348/100, 476, 558; 370/395.64; 710/2, 301, 305, 313; 715/700
See application file for complete search history.

(56) References Cited

U.S. PATENT DOCUMENTS

| | | | | |
|---|---|---|---|---|
| 6,078,361 | A * | 6/2000 | Reddy | 348/558 |
| 6,437,829 | B1 * | 8/2002 | Webb et al. | 348/476 |
| 6,600,747 | B1 * | 7/2003 | Sauber | 370/395.64 |
| 6,804,724 | B2 * | 10/2004 | Shin | 710/2 |
| 7,123,248 | B1 * | 10/2006 | Lafleur | 345/204 |
| 7,376,779 | B2 * | 5/2008 | Chu | 710/313 |
| 2002/0049879 | A1 * | 4/2002 | Eyer | 710/305 |
| 2002/0149541 | A1 * | 10/2002 | Shin | 345/3.1 |
| 2003/0035049 | A1 * | 2/2003 | Dickens et al. | 348/100 |
| 2003/0174156 | A1 * | 9/2003 | Katsuhara et al. | 345/700 |
| 2004/0233181 | A1 * | 11/2004 | Kobayashi | 345/204 |
| 2005/0144468 | A1 * | 6/2005 | Northcutt et al. | 713/189 |
| 2005/0246469 | A1 * | 11/2005 | Chu | 710/301 |
| 2007/0201492 | A1 * | 8/2007 | Kobayashi | 370/395.64 |
| 2007/0220279 | A1 * | 9/2007 | Northcutt et al. | 713/193 |
| 2007/0257923 | A1 * | 11/2007 | Whitby-Strevens | 345/520 |
| 2007/0286246 | A1 * | 12/2007 | Kobayashi | 370/522 |
| 2008/0148063 | A1 * | 6/2008 | Hanko et al. | 713/189 |

* cited by examiner

*Primary Examiner* — Xiaoliang Chen
(74) *Attorney, Agent, or Firm* — Altis Law Group, Inc.

(57) ABSTRACT

A computer motherboard includes a display controller, a digital visual interface integrated (DVI-I) connector, and a switching unit. The switching unit includes four first terminals, two second terminals, and a control terminal. Two of the first terminals are respectively connected to clock and data pins of a first display data channel (DDC) of the display controller, the other two first terminals are respectively connected to clock and data pins of a second DDC of the display controller, and the second terminals are respectively connected to DDC clock and DDC data pins of the DVI-I connector. The control terminal is connected to a hot plug detect pin of the DVI-I connector to detect a voltage and correspondingly control the second terminals to be respectively connected to the two first terminals connected to the clock and data pins of the first DDC or the second DDC.

3 Claims, 2 Drawing Sheets

COMPUTER MOTHERBOARD

BACKGROUND

1. Technical Field

The present disclosure relates to computer motherboards, and more particularly to a computer motherboard with adjustable display data channel (DDC) in accordance with type of monitor connected to the computer motherboard.

2. Description of Related Art

A DDC is configured for a computer motherboard to access a memory of a monitor, such as an electrically erasable programmable read-only memory (EEPROM), to read extended display identification data (EDID). The EDID includes manufacturer name and serial number, product type, phosphor or filter type, timings supported by the display, display size, luminance data and (for digital displays only) pixel mapping data. A display controller may be integrated in a north bridge chip or a central processing unit, and commonly includes a first DDC for reading analog EDID and a second DDC for reading digital EDID. The display controller is connected to the monitor through a connector of the computer motherboard, such as a digital visual interface integrated (DVI-I) connector.

The DVI-I connector includes a DDC clock pin and a DDC data pin for transferring EDID. The DVI-I connector also includes a hot plug detect pin to detect whether there is a digital monitor connected to the computer motherboard through the DVI-I connector. When a digital monitor is connected to the computer motherboard through the DVI-I connector, voltage at the hot plug detect pin is higher than 0.6 volts (V). When an analog monitor is connected to the computer motherboard through the DVI-I connector, voltage at the hot plug detect pin is lower than 0.2 V.

Because the DVI-I connector includes only one DDC, and the display controller includes two DDCs for accessing digital and analog monitors, respectively. Once the computer motherboard is produced, the DDC clock and DDC data pins of the DVI-I connector are connected to corresponding pins of one of the DDCs of the display controller, so the computer motherboard is only able to access a digital monitor or an analog monitor.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings in which like references indicate similar elements is illustrated by way of examples and not by way of limitation. It should be noted that references to "an" or "one" embodiment in this disclosure are not necessarily to the same embodiment, and such references mean at least one.

Figure 1:
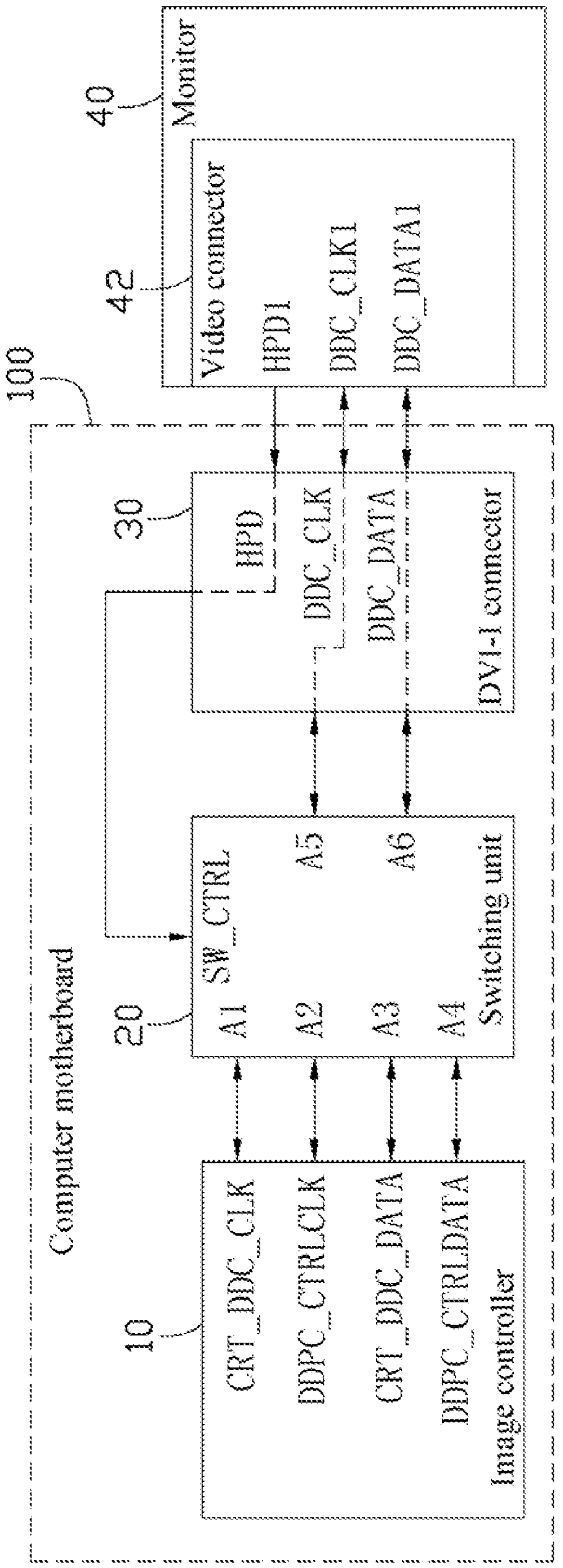
FIG. 1 is a block diagram of an embodiment of a computer motherboard including a switching unit.

Referring to FIG. 1, an exemplary embodiment of a computer motherboard 100 includes an display controller 10, a switching unit 20, and a digital visual interface integrated (DVI-I) connector 30. The DVI-I connector 30 is configured to be connected to a video connector 42 of a monitor 40.

The display controller 10 may be integrated in other components on the computer motherboard 100, such as a north bridge chip or a central processing unit. The display controller 10 includes a first and a second display data channels (DDCs). The first DDC includes a clock pin CRT_DDC_CLK and a data pin CRT_DDC_DATA, to access a memory of the monitor 40 to read analog extended display identification data (EDID). The second DDC includes a clock pin DDPC_CTRLCLK and a data pin DDPC_CTRLDATA, to access the memory of monitor 40 to read digital EDID. The memory of the monitor 40 may be an electrically erasable programmable read-only memory.

The switching unit 20 includes four first terminals A1-A4, two second terminals A5 and A6, and a control terminal SW_CTRL. The first and second terminals A1-A6 may function as either input terminals or output terminals. The first terminals A1-A4 are respectively connected to clock pins CRT_DDC_CLK and DDPC_CTRLCLK and data pins CRT_DDC_DATA and DDPC_CTRLDATA. The second terminals A5 and A6 are respectively connected to a DDC clock pin DDC_CLK and a DDC data pin DDC_DATA of the DVI-I connector 30. The control terminal SW_CTRL of the switching unit 20 is connected to a hot plug detect pin HPD of the DVI-I connector 30.

The DDC clock pin DDC_CLK and DDC data pin DDC_DATA of the DVI-I connector 30 are respectively connected to DDC clock pin DDC_CLK1 and DDC data pin DDC_DATA1 of the video connector 42 of the monitor 40. When the monitor 40 is a digital type, the hot plug detect pin HPD of the DVI-I connector 30 is connected to a hot plug detect pin HPD1 of the video connector 42. When the monitor 40 is an analog type, the hot plug detect pin HPD is idle. Other parts of the computer motherboard 100 are well known to those of ordinary skill in the art.

Figure 2:
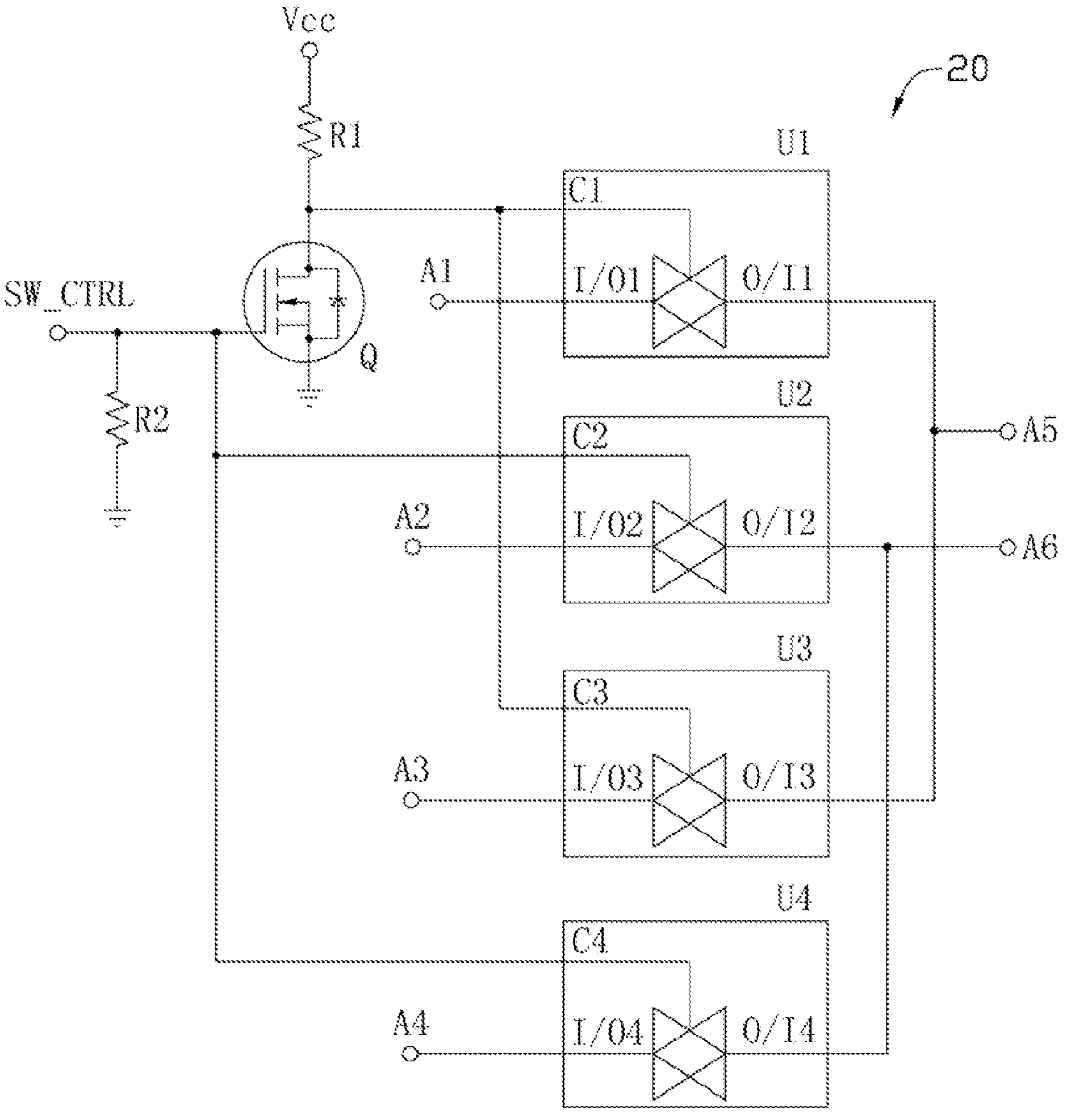
FIG. 2 is a circuit diagram of the switching unit of FIG. 1.

Referring to FIG. 2, the switching unit 20 includes a metal-oxide-semiconductor field-effect transistor (MOSFET) Q, four bilateral switches U1-U4, and two resistors R1 and R2. A gate of the MOSFET Q functioning as the control terminal SW_CTRL of the switching unit 20 is grounded via the resistor R2. A source of the MOSFET Q is grounded. A drain of the MOSFET Q is connected to a power source VCC through a resistor R1. The bilateral switches U1-U4 are all single bilateral switches, such as 74V1G66 type switches, including a control pin, a first pin, and a second pin, wherein the first and second pins may be used as either input pins or output pins. Each of the bilateral switches U1-U4 is turned on when the corresponding control pin is at high voltage level, and is turned off when the control pin is at a low voltage level. A control pin C1 of the bilateral switch U1 and a control pin C3 of the bilateral switch U3 are both connected to the drain of the MOSFET Q. A control pin C2 of the bilateral switch U2 and a control pin C4 of the bilateral switch U4 are both connected to the gate of the MOSFET Q. First pins I/O1, I/O2, I/O3, and I/O4 of the bilateral switches U1-U4 respectively function as the first terminals A1-A4 of the switching unit 20, a second pin O/I1 of the lateral switch U1 and a second pin O/I3 of the lateral switch U3 are connected together functioning as the second terminal A5, a second pin O/I2 of the lateral switch U2 and a second pin O/I4 of the lateral switch U4 are connected together functioning as the second terminal A6.

In use, when the video connector 42 of the monitor 40 is a DVI-I connector, the video connector 42 is directly connected to the DVI-I connector 30 of the computer motherboard 100 through a DVI-I cable (not shown). The monitor 40 may work in analog mode or digital mode.

When the monitor 40 works in analog mode, the voltage of the hot plug detect pin HPD1 of the video connector 42 is lower than 0.2 V because the hot plug detect pin HPD1 is idle, the gate of the MOSFET Q is at low voltage level, the MOSFET Q is turned off, the drain of the MOSFET Q outputs high voltage to the control pins C1 and C3 of the bilateral switches U1 and U3, the bilateral switches U1 and U3 are turned on. The control pins C2 and C4 of the bilateral switches U2 and U4 are both at low voltage level, the bilateral switches U2 and U4 are turned off. The clock pin CRT_DDC_CLK and data pin CRT_DDC_DATA of the first DDC of the display controller 10 are respectively connected to the DDC clock pin DDC_CLK1 and DDC data pin DDC_DATA1 of the video connector 42 through the bilateral switches U1 and U3 and the DVI-I connector 30. The display controller 10 outputs a read request for analog EDID to the monitor 40 through the clock pin CRT_DDC_CLK and data pin CRT_DDC_DATA of the first DDC, then analog EDID of the monitor 40 is transferred to the computer motherboard 100.

When the monitor 40 works in digital mode, the hot plug detect pin HPD1 of the video connector 42 of the monitor is at high voltage level, the gate of the MOSFET Q is at high voltage level, the MOSFET Q is turned on, the drain of the MOSFET Q outputs a low voltage to the control pins C1 and C3 of the bilateral switches U1 and U3, the bilateral switches U1 and U3 are turned off. The control pin C2 and C4 are at high voltage level, the bilateral switches U2 and U4 are turned on, so the clock pin DDPC_CTRLCLK and data pin DDPC_CTRLDATA of the second DDC are respectively connected to the DDC clock pin DDC_CLK1 and DDC data pin DDC_DATA1 of the video connector 42 through the bilateral switches U2 and U4 and the DVI-I connector 30. The display controller 10 outputs a read request for digital EDID to the monitor 40, then, digital EDID of the monitor 40 is transferred to the computer motherboard 100.

When the video connector 42 is a video graphics array (VGA) connector, the video connector 42 could be connected to the DVI-I connector 30 through a DVI-I cable (not shown) and a DVI-I-to-VGA adapter. Communication between the monitor 40 and the computer motherboard 100 is the same as above-mentioned when the monitor 40 works in analog mode.

In other embodiments, the MOSFET Q may be replaced with another type of electronic switch, such as a bipolar junction transistor.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A computer motherboard comprising:

a display controller comprising a first and a second display data channels (DDCs), each of the first and second DDCs includes a clock pin and a data pin;

a digital visual interface integrated (DVI-I) connector to be connected to a video connector of a monitor, comprising a first DDC clock pin, a first DDC data pin, and a hot plug detect pin, wherein the first DDC clock pin and first DDC data pin are respectively connected to a second DDC clock pin and a second DDC pin of the video connector; and a switching unit comprising four first terminals, two second terminals, and a control terminal, wherein two of the first terminals are respectively connected to the clock and data pins of the first DDC, the other two of the first terminals are respectively connected to the clock and data pins of the second DDC, the second terminals are respectively connected to the DDC clock pin and the DDC data pin of the DVI-I connector, the control terminal is connected to the hot plug detect pin of the DVI-I connector, to detect a voltage of the hot plug detect pin and correspondingly control the second terminals to be respectively connected to two corresponding first terminals that is respectively connected to the clock pin and data pin of the first or second DDC;

wherein the switching unit comprises:

an electronic switch comprising first to third terminals, wherein the first terminal functions as the control terminal, the second terminal is grounded, the third terminal is connected to a power source via a first resistor, the electronic switch is turned on when the first terminal is at high voltage level;

first to fourth bilateral switches, wherein each of the first to fourth switches comprises a control pin, a first pin, and a second pin, wherein the control pin is configured to turn on or turn off the corresponding bilateral switch, the control pins of the first and third bilateral switches are both connected to the third terminal of the electronic switch, the control pins of the second and fourth bilateral switches are both connected to the first terminal of the electronic switch, the first pins of the first and third bilateral switches functioning as the two first terminals of the switching unit are respectively connected to the clock pin and data pin of the first DDC, the first pins of the second and fourth bilateral switches functioning as the other two first terminals of the switching unit are respectively connected to the clock pin and data pin of the second DDC, the second pins of the first and third bilateral switches are connected together and the second pins of the second and fourth bilateral switches are connected together to function as the second terminals of the switching unit, respectively.

2. The computer motherboard of claim 1, wherein the electronic switch is a metal-oxide-semiconductor field-effect transistor, the first to third terminals of the electronic switch are respectively a gate, a source, and a drain.

3. The computer motherboard of claim 1, wherein the first terminal of the electronic switch is grounded via a second resistor.

* * * * *